United States Patent
Haner et al.

(10) Patent No.: US 6,177,798 B1
(45) Date of Patent: Jan. 23, 2001

(54) FLOW-THROUGH NMR PROBE HAVING A REPLACEABLE NMR FLOW TUBE

(75) Inventors: Ronald L. Haner, San Francisco; Justine Y. Lee, Mountain View, both of CA (US)

(73) Assignee: Varian, Inc., Palo Alto, CA (US)

( * ) Notice: Under 35 U.S.C. 154(b), the term of this patent shall be extended for 0 days.

(21) Appl. No.: 09/361,658

(22) Filed: Jul. 27, 1999

(51) Int. Cl.$^7$ .................................................. G01V 3/00
(52) U.S. Cl. ........................ 324/321; 324/322; 324/300
(58) Field of Search .................................. 324/321, 322, 324/300

(56) References Cited

U.S. PATENT DOCUMENTS

| | | | |
|---|---|---|---|
| 5,258,712 | 11/1993 | Hofmann et al. ................ | 324/318 |
| 5,302,900 | * 4/1994 | Cummings ....................... | 324/321 |
| 5,397,989 | * 3/1995 | Spraul et al. .................... | 324/321 |
| 5,705,928 | * 1/1998 | Haner et al. ..................... | 324/321 |
| 5,867,026 | 2/1999 | Haner ............................... | 324/321 |

OTHER PUBLICATIONS

Article by Haw et al., entitled "Continuous Flow High Field Nuclear Magnetic Resonance Detector for Liquid Chromatographic Analysis of Fuel Samples," published in *Anal. Chem.* in 1981, vol. 53, pp. 2327–2332.
Article by Barjat et al., entitled "Adaptation of Commeircal 500 MHz Probes for LCNMR," published in *Journal of Magnetic Resonance* in 1996, Series A 119, pp. 115–119.
Article by Albert et al., entitled "High–Performance Liquid Chromatography–Nuclear Magnetic Resonance On–Line Coupling," published in *Trends in Analytical Chemistry* in 1988, vol. 7, No. 8, pp. 288–293.
Article by Stevenson et al., entitled "$^{13}$C Dynamic Nuclear Polarization: A Detector For Continuous–Flow, On–Line Chromatography" published in *Anal. Chem.* in 1994, vol. 66, pp. 2993–2999.

* cited by examiner

*Primary Examiner*—Christine Oda
*Assistant Examiner*—Brij B. Shrivastav (57) ABSTRACT

A flow-through NMR probe having an NMR flow tube that is easily inserted or removed is provided together with a method for exchanging the flow tube assembly in the probe. The NMR flow tube is positioned through a lower and upper insulator in a flow-through NMR probe by the use of a guide tube. The upper and lower insulators preferably comprise a pulsed field gradient housing. The guide tube leads from the base of the probe to the lower insulator. The NMR flow tube with attached inlet tubing is inserted into the probe through the guide tube and aligned along the central axis of the probe through upper and lower insulators. The flow tube is aligned using upper and lower insulator rings positioned in the upper and lower insulators. The ease of insertion or exchange of the flow tube in the probe is further promoted by the guide tube having a smoothly tapered inner surface. Once the NMR flow tube is disposed through the lower and upper insulators and lower and upper insulator rings, the outlet end of the flow tube is connected to an outflow tubing with a detachable connector. The lower end of the connector is then seated in a key in the upper insulator ring to position the flow tube for spectral measurements. The flow-through NMR probes and flow tube assemblies in accordance with the invention are useful in continuous flow-through analysis or stop-flow analysis applications, particularly for applications that couple high performance liquid chromatography (HPLC) with nuclear magnetic resonance spectroscopy (NMR), including flow-based NMR sampling.

23 Claims, 5 Drawing Sheets

FLOW-THROUGH NMR PROBE HAVING A REPLACEABLE NMR FLOW TUBE

FIELD OF THE INVENTION

The invention in general relates to the field of chemical analysis, more particularly to the fields of high performance liquid chromatography (HPLC) and nuclear magnetic resonance spectroscopy (NMR), and still more particularly to a flow-through NMR flow tube used for the on-line coupling of the two analytical techniques. Specifically, the invention pertains to a flow-through NMR probe having replaceable NMR flow tube assembly and a method for the efficient insertion and removal of an NMR flow tube in a flow-through NMR probe. The invention allows for ease of replacement of an NMR flow tube in a flow-through configuration to optimize performance and minimize downtime for the coupled HPLC-NMR analytical techniques without requiring major modification of the probe structure.

BACKGROUND OF THE INVENTION

An NMR apparatus is most often characterized in gross by cylindrical symmetry. A typical NMR magnet is of the superconducting variety and is housed in a dewar which includes a room temperature cylindrical bore in which a very carefully controlled homogeneous magnetic field is sustained by operation of the superconducting magnet in the interior of the dewar. An NMR probe holds a sample placed in the uniform magnetic field. The housing for the probe is typically cylindrical to fit within the bore of the magnet and the sample is generally positioned along the central axis of the probe. A coil is disposed close to the sample within the probe to apply an exciting radio frequency (RF) magnetic field to the sample. The resultant resonance signal of the sample is picked up by the coil and delivered to a receiver circuit. The receiver circuit generates an output signal. A computer takes the Fourier transform of the signal to obtain an NMR spectrum.

HPLC is widely used to separate organic mixtures for analysis. Although ultraviolet, infrared and mass spectroscopy have been used for qualitative analyses of HPLC eluents, NMR spectroscopy generally provides unequaled structural information and has sample requirements more reasonably matched to HPLC. Efforts to couple these two analytical techniques, however, have been hampered by the low sensitivity of the NMR detector. Recent improvements in NMR detection cells for use in flow-through NMR probes have allowed for high resolution, high sensitivity and ease of use in HPLC-NMR coupled analyses. See, for example, U.S. Pat. No. 5,867,026, entitled "Flow Tube for NMR Probe" disclosing an improved flow-through NMR detection cell and method of manufacture. Such improved flow tube designs have led to increased acceptance and usage of sample placement for NMR spectrometers using fluid injection methods and have created further interest in flow-based automatic sample measurement. As these techniques become more routinely used and accepted, the minimization of downtime for the NMR and the optimization of system performance for efficient measurement throughout become increasingly advantageous.

Current NMR flow tube assemblies, including the NMR sample flow tube together with its various connectors and associated tubing for attachment to an HPLC, are delicate, difficult to handle and not well suited for exchange in the field. Removal and insertion of such assemblies in the NMR probe is risky and expensive, at least in part because the flow tubes (and attached connectors) are positioned and secured to the NMR probe within nested assemblies of coils, dewars, and support structures. Many present designs require significant mechanical interaction with these closely mated subassemblies. Electrical manipulations are often needed to exchange the flow tube, such as unsoldering and resoldering of the RF and pulsed field gradient coils. Some designs have RF circuitry directly attached and secured to the flow tubes. There is an additional cost and risk associated with exchange of the flow tube in these designs because of the directly secured RF circuitry.

Other flow tube assembly designs that promise exchangeability of the NMR flow tube require significant modification of the NMR probe or subassemblies to accommodate the removable flow tube. Such designs generally utilize fully integrated flow tube assemblies having parts and associated tubing that are permanently bonded together with chemical adhesives. See, e.g., Barjat et al., "Adaptation of Commercial 500 MHz Probes for LCNMR," Journal of Magnetic Resonance, Series A 119, 115–119 (1996). These NMR flow tubes offer the advantage of a high filling factor due to their slender construction and consistent outside diameter, however, such fully assembled and permanently bonded structures do not allow rapid exchange of the flow tube or associated tubing, for cleaning or optimizing individual applications. They also lack mechanical reproducibility due to difficulties in controlling the adhesive-assembly process. Moreover, the possibility of contact between the analytical solutions and the adhesives used in bonding the parts of fully such integrated assemblies can cause chemical compatibility problems and sample contamination.

Ease-of-exchange of the NMR flow-tube is important. Users often wish to change or exchange the flow tube assembly since flow tubes and attached tubing can become clogged over time or reach the point where cleaning protocols are insufficient. The flow tubes or tubing may break and require replacement or the user may wish to incorporate a post-probe sample collector. Moreover, users may wish to optimize the sample chamber of the flow tube for various applications, for example, if research shifts to samples where quantities are limited. What is needed is an NMR flow tube assembly of inert construction that permits the simple and efficient removal and insertion of an NMR flow tube in a flow-through NMR probe with a minimum amount of probe modification while maintaining a high filling factor.

SUMMARY OF THE INVENTION

The invention described here provides a cost-effective, reliable and robust NMR flow tube assembly that allows for ease of replacement of an NMR flow tube in a flow-through NMR probe while maintaining good NMR sensitivity. The invention requiring only modest modification of the NMR probe assembly and can be assembled without chemical adhesives. The invention further provides a method for inserting and removing an NMR flow tube in a flow-through NMR probe that helps minimize downtime and optimize performance for sample measurement in an HPLC-NMR environment.

In accordance with one aspect of the present invention, a flow-through NMR probe is provided which comprises a lower insulator and an upper insulator supported at a distance apart within the probe. The various probe subassemblies, including coils, dewars and support structures necessary for sample spectroscopic measurements, are typically positioned between the upper and lower insulators in the probe. Each insulator has an opening or aperture aligned along the central axis of the probe. An upper and lower insulator ring are positioned in the upper and lower insulators to help align an NMR flow tube in the probe. A guide tube is attached at a first end to the bottom of the lower insulator for communicating along the central axis of the probe through the opening in the lower insulator and toward the opening in the upper insulator. The guide tube extends downward to the base of the probe. An NMR flow tube, attached to inflow tubing at an inlet end by a detachable connector and fitted with a lower spacer ring may be inserted through the guide tube into the probe.

Using the guide tube, the flow tube is slid into position through the lower and upper apertures and the various probe subassemblies. The upper insulator ring is fitted over the outlet end of the flow tube. The outlet end of the flow tube is attached to an outflow tube by a detachable connector. The connector is then seated in a key or notch in the top of the upper insulator ring to position the NMR flow tube for spectroscopic measurements.

In accordance with a second aspect of the invention, the guide tube may be provided with an inner diameter at the first end that is substantially equal to the inner diameter of the lower insulator ring and sufficient to slidably traverse an NMR flow tube. The inner diameter at the second end of the guide tube is larger than at the first end. The inner surface of the guide tube is substantially smoothly tapered from the inner diameter of the second end to the inner diameter of the first end. The lower insulator ring is disposed inside the lower aperture and the guide tube is connected at the first end to the lower insulator ring to communicate through the ring and the lower aperture along the axis of the probe. An NMR flow tube with attached inflow tubing may then be inserted from the second end of the guide tube into the probe. The smooth inner surface of the guide directs the outlet end of the flow tube through the lower aperture, the probe subassemblies and upper aperture while the lower insulator ring aligns the inlet end of the flow tube along the central axis of the probe. The upper insulator ring is slipped over the outlet end of the flow tube and disposed in the upper aperture to align the outlet end of the flow tube along the axis of the probe. The outlet end of the flow tube may then be attached to an outflow tube by a detachable connector and the connector seated in a key in the top of the upper insulator ring to position the flow tube for spectroscopic measurements.

It is another aspect of the invention to provide an NMR flow tube assembly comprising an NMR flow tube with its associated inflow and outflow tubing and connectors together with an upper and lower insulator ring and a guide tube having a conically tapered inner surface for use in a flow-through NMR probe. The flow tube assembly can be constructed with inert parts without the use of chemical adhesives.

In accordance with yet another aspect of the present invention, a method for inserting a replaceable NMR flow tube into a flow-through NMR probe is provided. The method permits simple and efficient insertion of the NMR flow tube in the probe without disturbing or modifying the probe subassemblies. The method requires only modest modification of the probe. The probe comprises a lower insulator having a lower aperture, and an upper insulator supported at a distance above the lower insulator. The upper insulator has an upper aperture aligned on a substantially vertical axis with the lower aperture. The method for inserting a flow tube in the probe comprises attaching a guide tube at a first end to the lower insulator for communicating through the lower aperture toward the upper aperture along the axis. The guide tube has a first end with an inner diameter that is sufficient to slidably traverse an NMR flow tube and align the tube along the axis. The guide tube has a second end with an inner diameter larger than the inner diameter of the first end. The inner surface of the guide tube is substantially smoothly tapered from the inner diameter of the first end to be inner diameter of the second end.

An NMR flow tube having an inlet end connected to an inflow tube is slidably disposed from the second end of the guide tube through the first end of the guide tube, the lower aperture, the upper aperture and an upper insulator ring to extend the outlet end of the flow tube above the upper insulator. The upper insulator ring is slidably disposed into the first aperture to align the outlet end of the flow tube along the axis. The outlet end of the NMR flow tube is detachably connected to an outflow tube above the upper insulator and the connector is seated in a key or notch in the top of the upper insulator ring to position the NMR tube in the probe.

It is another aspect of the present invention to provide a method for removing an NMR flow tube from a flow-through NMR probe as described. The method requires removing the connector from the outlet end of the flow tube to disconnect the outflow tubing and then sliding the upper insulator ring from the upper aperture and off of the flow tube. The flow tube is then extracted from the upper aperture and the lower aperture through the guide tube and out the base of the probe.

The invention described can be used in continuous flow-through analysis, stop-flow analysis flow-based sampling analysis and other applications. The invention is particularly useful in liquid chromatography (LC) applications but is not so limited. The invention is applicable to flow-through NMR sample introduction in general.

BRIEF DESCRIPTION OF THE DRAWINGS

The foregoing aspects and advantages of the present invention will become better understood upon reading the following detailed description and upon reference to the drawings where.

DETAIL DESCRIPTION OF THE INVENTION

Figure 1:
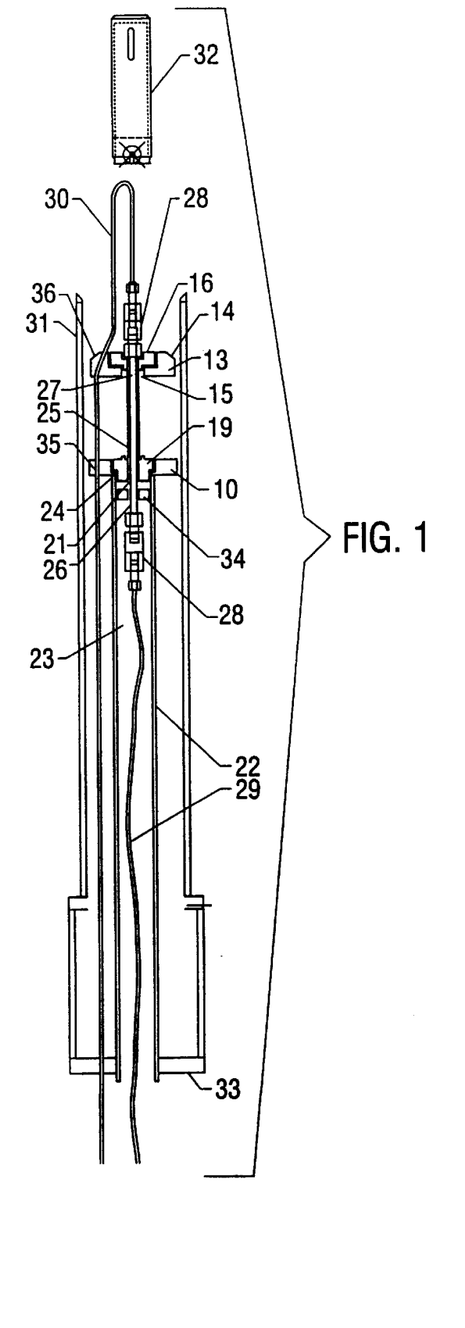
FIGS. 1 and 1A are cross-sectional views of an NMR flow tube in a continuous flow-through NMR probe arrangement according to the present invention.
Figure 1A:
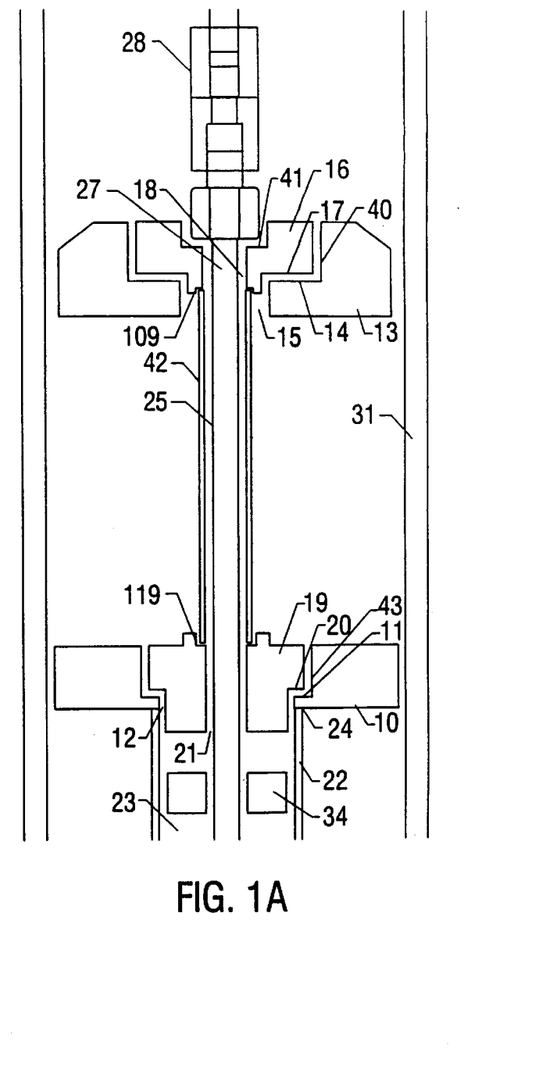

The flow-through NMR probe assembly shown in FIGS. 1 and 1A of the present invention is first described in detail.

Figure 2:
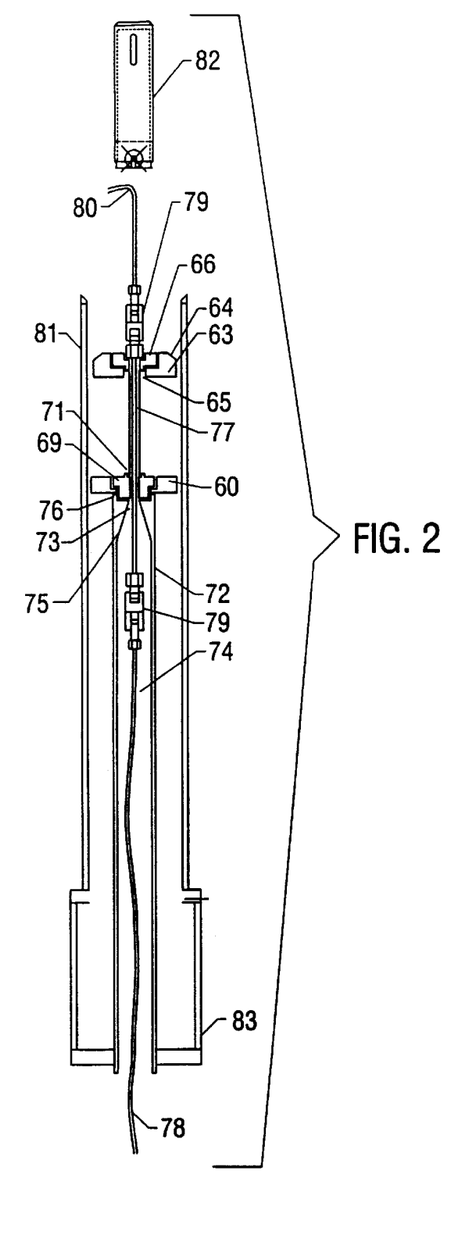
FIGS. 2 and 2A are cross-sectional views of a second embodiment of an NMR flow tube in a continuous flow-through NMR probe arrangement according to the present invention.
Figure 2A:
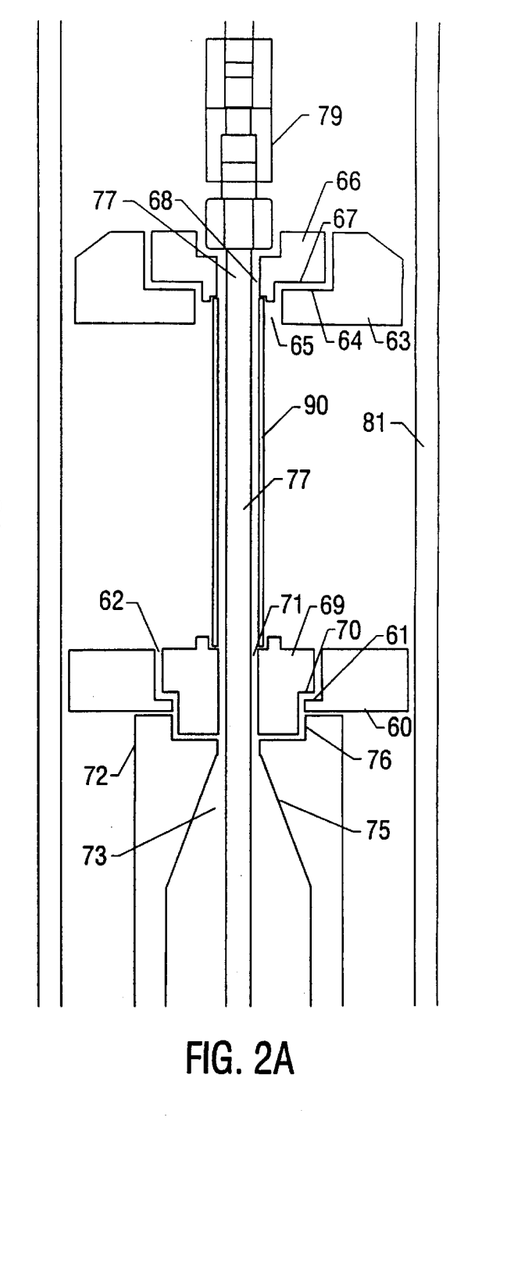
Figure 7:
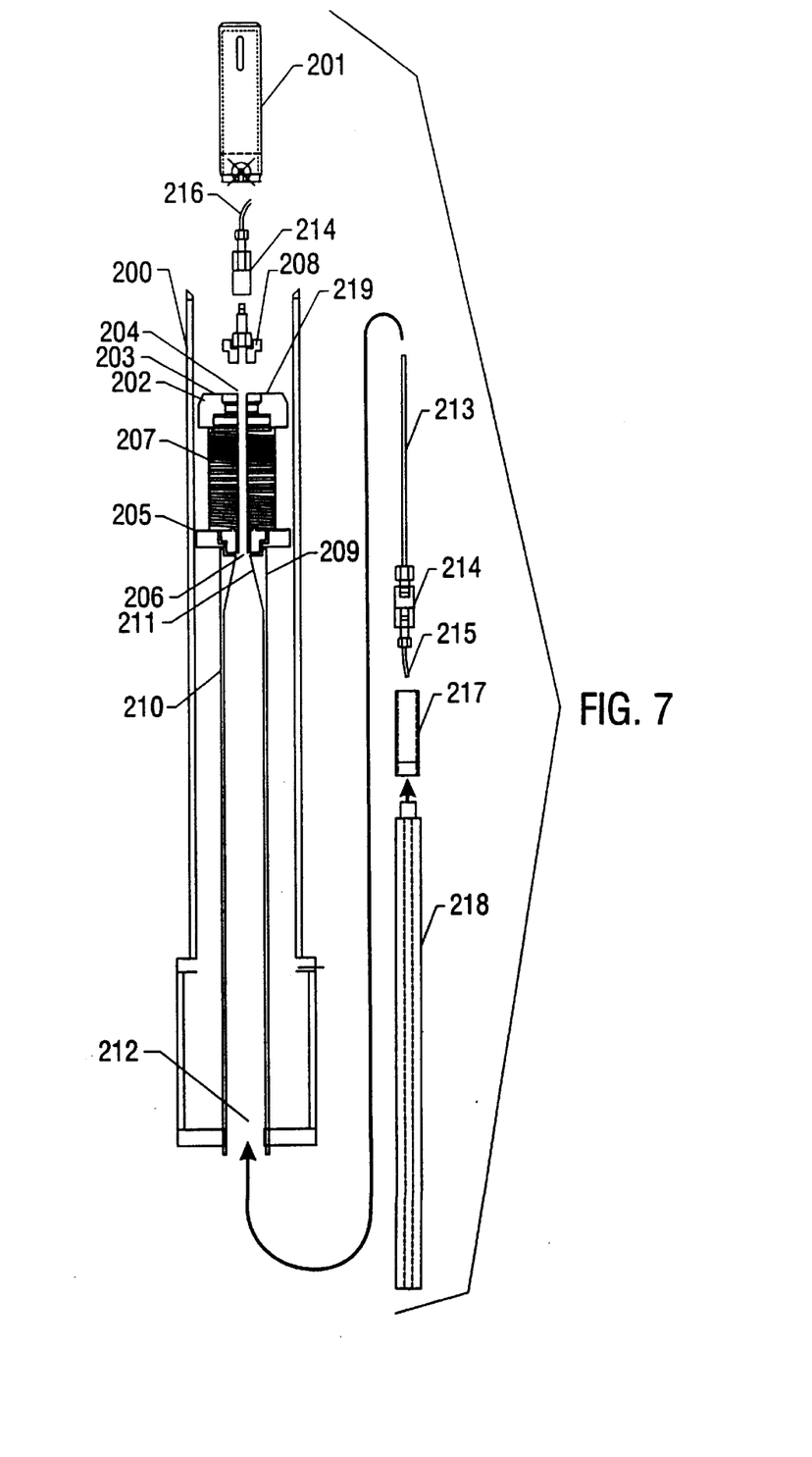
FIG. 7 is a cross-sectional view of a flow-through NMR probe and a schematic diagram illustrating the insertion of an NMR flow tube into the probe according to the present invention.

Further embodiments of the invention as shown in FIGS. 2 and 2A are then discussed. The method of the present invention for inserting and removing an NMR flow tube in a flow-through NMR probe as illustrated in FIG. 7 is then discussed in further detail.

Referring to FIGS. 1 and 1A, a first embodiment of the flow-through probe of the present invention comprises a generally cylindrical probe housing 31 which fits within the cylindrical bore of the super conducting magnet. The probe houses the probe subassemblies, including nested assemblies of coils, shields, dewars and support structure not shown in FIG. 1. The probe is typically inserted in the upright vertical position into the bore of the superconducting magnet, thereby aligning the central or vertical axis of the probe with the vertical axis of the magnet. An NMR tube containing a sample is positioned within the probe subassembly substantially along the central axis of the probe and within the field center or "sweet spot" of the magnet for spectroscopic measurement.

A lower insulator 10 is supported within the probe housing 31 having a lower aperture 12 and a top surface 11. The lower insulator is preferably circular to fit within the cylindrical housing 31 and may comprise further apertures, channels, supports and connections for the probe subassemblies. The lower aperture 12 is located substantially on the central axis of the probe and is preferably a circular hole of sufficient diameter to permit easy passage of an NMR flow tube without restrictions, i.e. on the order of 3–5 mm or more. The lower aperture 12 may be stepped or notched as shown in FIG. 1A to accommodate the shape and constraints of a lower insulator ring 19 as shown at 43 in FIG. 1A.

As shown in FIGS. 1 and 1A, the probe further comprises an upper insulator 13, supported at a distance above lower insulator 10 and having an upper surface 14 and an upper aperture 15. The upper aperture 15 is preferably a circular hole which is aligned substantially along the vertical axis of the probe with the lower aperture 12 and is also of sufficient diameter to permit easy passage of an NMR flow tube. The upper aperture may also be stepped or notched to accommodate an upper insulator ring 16 as shown at 40 in FIG. 1A. As with the lower insulator 10, the upper insulator 13 is preferably circular to fit within the probe housing and may contain a various additional apertures, channels, supports and connections for the probe subassemblies which are typically housed between the upper and lower insulators 10 and 13. In particular, the RF coil (not shown in FIG. 1) for the probe is typically positioned along the probe axis between the upper and lower insulators 10 and 13. The RF coil may be free standing or incorporated into a quartz tube insert 42, as shown in FIG. 1A, mounted along the axis between the upper and lower insulators 10 and 13. Commonly, and preferably, the upper insulator 13 and lower insulator 10 comprise the top and bottom caps of a housing for a pulsed field gradient coil such as 207 shown in FIG. 7. Such pulsed field gradient coils, as well as RF coils and inserts incorporating RF coils, their use and construction, are well known to those of skill in the art of NMR spectroscopy.

The upper and lower insulators are made of suitable non-magnetic materials that will not interfere with NMR measurements. Such non-magnetic materials are well known to those of ordinary skill and include, for example, Kel-F, PTFE and ceramic materials.

Figure 4A:
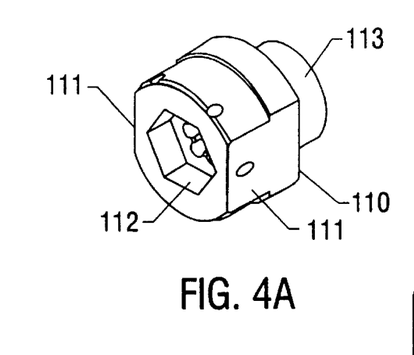
FIGS. 4A and 4B are partial side views of an upper insulator ring.
Figure 4B:
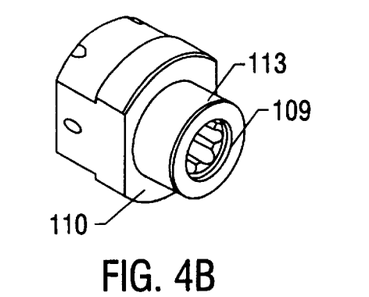

Referring again to FIGS. 1 and 1A, the probe further comprises an upper insulator ring 16 which may have an upper constraint 17. The inner diameter 18 of the upper insulator ring 16 is a sufficient size to slidably traverse an NMR flow tube 25. The top of the upper insulator ring is keyed or notched to accommodate the lower end of the connector 28 and hold the attached flow tube 25 in position in the probe as shown in FIG. 1 and at 41 in FIG. 1A. The ring 16 is disposed inside the upper aperture 15. The ring 16 acts as a spacer in the aperture 15 to attain axial symmetry for the flow tube 25 along the probe axis. The upper constraint 17 may bear against the upper surface 14 of the upper insulator 13 to adjust the position of flow tube 25 within the probe subassemblies and maintain the ring 16 in place. Alternatively, the ring 16 may be secured in place with set screws or the like, or the ring 16 and the upper insulator 13 may be one integral piece. A suitable design for the upper insulator ring 16 is shown in FIGS. 4A and 4B which illustrate a cylindrical portion 113 of the ring and an upper constraint 110 for disposition inside the upper aperture 15 in FIG. 1. The upper constraint 110 can bear against the upper surface 14 of the upper insulator 13 as shown in FIGS. 1 and 1A.

Figure 4C:
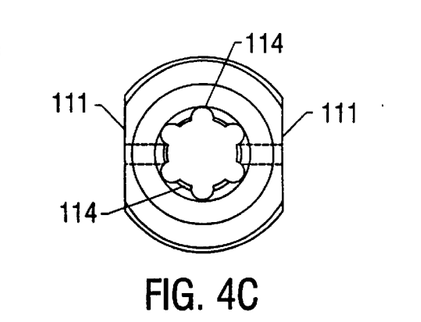
FIG. 4C is a cross-sectional end-on view of an upper insulator ring.

A lower constraint or ridge 109 in the inner diameter at the bottom of the upper insulator ring is also shown in FIG. 4B to accommodate the upper end of an insert incorporating an RF coil for the probe. As shown in FIG. 1A, the constraint 109 bears against the top of the insert 42 to align it along the probe axis and secure it in place in the probe. FIG. 4C shows a cross-sectional view of the inner diameter of the upper insulator ring for traversing an NMR flow tube and aligning the tube in place in the tipper aperture 15 of FIGS. 1 and 1A. The upper insulator ring is preferably made of Kel-F, PTFE or other NMR compatible materials. The upper insulator ring may also comprise channels 115 or other holes to direct air flow around the outside of the NMR flow tube. The use of such channels or holes is well known in the art for adjusting the temperature of the flow tube and sample during spectroscopic measurements.

FIGS. 1 and 1A further show a lower insulator ring 19 having a lower constraint 20. The lower insulator ring 20 has an inner diameter 21. Inner diameter 21 is sufficient to slidably traverse an NMR flow tube 25 and is substantially the same size as the inner diameter of the upper insulator ring. The lower insulator ring 19 is disposed inside the lower aperture 12. The ring 19 acts as a spacer to align the axial symmetry of the flow tube 25 along the probe's central axis. The lower constraint 20 may bear against the top surface 11 of a step in the lower insulator 10 to aid in adjusting the position of the NMR flow tube 25 and to maintain ring 19 in place. Alternatively, the ring 16 may be secured in place with set screws or other means, or the ring 19 and the lower insulator 10 may be one integral piece.

Figure 5A:
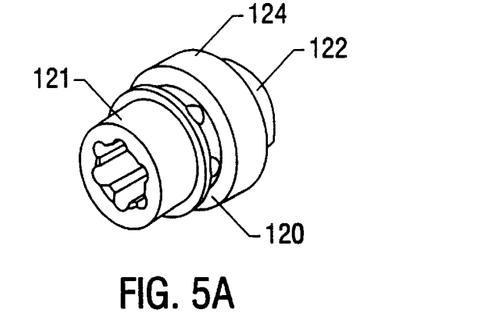
FIGS. 5A and 5B are partial side views of a lower insulator ring.
Figure 5B:
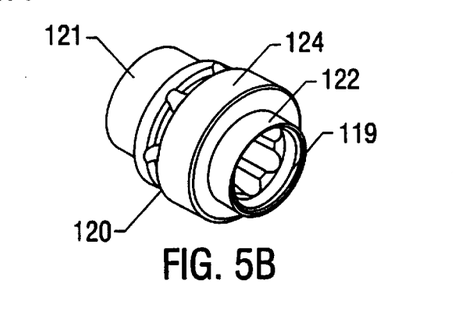
Figure 5C:
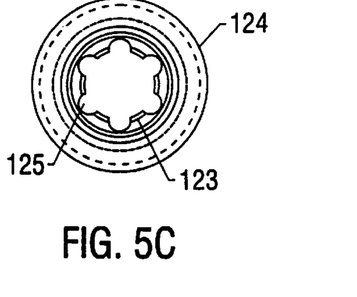
FIG. 5C is a cross-section end-on view of a lower insulator ring.

A suitable design for the lower insulator ring 19 is shown in FIGS. 5A and 5B which illustrate cylindrical portion 124 for positioning inside the lower aperture 12 as shown in FIG. 1A. A lower constraint 120 is shown in FIGS. 5A and 5B which may be used to bear against the top surface 11 of the lower insulator 10 in FIGS. 1 and 1A. FIG. 5C shows a cross-sectional view of the inner diameter of the lower insulator ring for traversing an NMR flow tube and aligning it in the lower aperture 12 of FIG. 1. The lower insulator ring is preferably made of Kel-F, PTFE or other NMR compatible material. The lower insulator ring may also comprise channels 125 or other holes to direct air flow past the NMR flow tube. An upper constraint or ridge 119 in the top of the inner diameter of the lower insulator ring is also shown in FIG. 5B to accommodate the lower end of an insert incorporating an RF coil. As shown in FIG. 1A, the constraint 119 bears against the bottom of the insert 42 to align it along the probe axis and secure it in place in the probe.

Figure 3A:
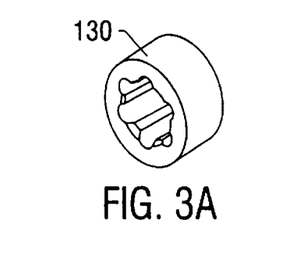
FIG. 3A is a partial side view of a spacer ring.
Figure 3B:
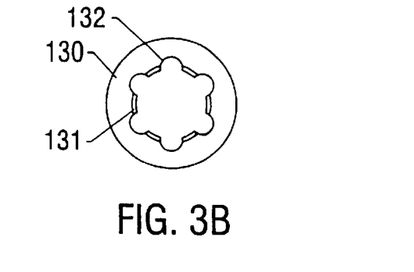
FIG. 3B is a cross-sectional end-on view of a spacer ring.

Referring again to FIGS. 1 and 1A, the probe further comprises a spacer ring 34. The inner diameter of the spacer ring 34 is a sufficient size to slidably traverse an NMR flow tube 25 but form a snug friction fit and remain in place on the flow tube. The spacer ring 34 acts as a spacer to the NMR flow tube 25 as the flow tube is inserted into the probe through a guide tube 22. A suitable design for the spacer ring is shown in FIGS. 3A and 3B. FIG. 3B shows a cross-sectional view of the inner diameter 131 for tightly traversing the NMR flow tube. The outer diameter 130 of the spacer ring is of a size that can be passed through the guide tube 22 after the ring has been fitted over an NMR flow tube. The spacer ring is preferably made of Kel-F, PTFE or other NMR compatible material. The spacer ring may also comprise air channels 132 or other holes to direct air flow past the NMR flow tube.

A guide tube 22 is provided for communicating through the lower aperture ring 12 along the probe's central axis. As shown in FIGS. 1 and 1A, the guide tube is attached at a first end 24 to the bottom of the lower insulator 10 or alternatively to the lower portion of the lower insulator ring 19 protruding below the lower insulator. The inner diameter 23 of the guide tube 22 is sufficiently large to accommodate the outer diameter of the spacer ring 34 so that the ring 34, having a flow tube 25 tightly disposed through it, may be slid upward through the guide tube from the outlet end to slidably guide the flow tube through the lower aperture 12. The inner diameter of the guide tube is preferably 9 mm to 15 mm. The outer diameter of the connector 28 attached to the inlet end of the flow tube 25 should be no larger than the outer diameter of the spacer ring 34 to permit the connector to pass upward through the guide tube as the NMR flow tube is positioned in the probe. The guide tube 22 preferably extends to the base of the probe 31 and is preferably cylindrical with a smooth inner surface. The guide tube is preferably constructed of Kel-F, PTFE or some other NMR compatible material.

In an alternative embodiment, the inlet end of NMR tube 25 may be elongated sufficiently at the inlet end to extend entirely through the guide tube and out the bottom end of the probe. In such an embodiment, the inner diameter of the guide tube could be substantially reduced to a size sufficient to allow only the NMR flow tube to slide through and thereby eliminate the need for a spacer ring 34. For temperature regulation of the sample, such design could include an annular gap to permit air flow past the flow tube. The outer diameter of guide tube 22 could also be reduced accordingly which would permit use of the present invention in probes having limited internal space.

As shown in FIG. 1, an NMR flow tube 25 is extended through the guide tube 22 and the upper and lower insulators 10 and 13, and positioned along the central axis of the probe through the upper and lower insulator rings 16 and 19. The NMR flow tube 25 comprises an inlet end 26 and an outlet end 27 attached by connectors 28 to an inflow tube 29 and outflow tube 30. The outflow tube 30 may be threaded out the top of the probe and then out the top of the magnet's bore when the probe is inserted in the magnet but preferably the outlet tube is rerouted down through additional openings 36 and 35 in the upper insulator 13 and the lower insulator 10 and ultimately out the base 33 of the probe.

According to the present invention, the NMR flow tube 25 is not directly attached to an RF coil or any other portion of the probe subassembly mounted between the upper and lower insulator. Instead the flow tube is free to move up and down through the upper and lower insulators, passing through any shields or coils that comprise the probe subassembly (not shown in FIG. 1). Thus, the traditional inconvenience and risk of unsoldering and resoldering nested assemblies of coils and other structure within the probe subassembly are avoided. Moreover, no additional modification of the probe subassembly is necessary to accommodate the NMR flow tube and since only the flow tube itself, and not the detachable connector, is inserted through the probe subassembly, a good filling factor for the RF coil is maintained.

To position the NMR flow tube 25 in the probe, the inlet end 26 is attached to the inflow tubing 29 using a connector 28. A spacer ring 34 is slipped onto the flow tube 25 before inserting the flow tube 25 into the probe. This flow tube partial assembly is inserted into the probe via the guide tube 22 using the spacer ring 34 to align the flow tube along the central axis of the probe. Once the flow tube is inserted through the lower and upper insulators 10 and 13 and the upper insulator ring 16, the upper insulator ring 16 is positioned in the upper aperture 15 to align the flow tube 25 along the central axis. The upper insulator ring 16 will also secure the upper end of the insert 42 if present. The outlet end of the flow tube 27 may then be attached by connector 28 to the outflow tube 30. Thus, the remaining connector 28 is attached to the outlet end 27 of the flow tube 25 with the flow tube situated inside the NMR probe. The connector 28 attached to the flow tube is then seated in the key or notch in the top of the upper insulator ring 16 to position the flow tube for spectral measurements. The procedure is reversed to remove the flow tube from the probe.

NMR flow tube 25 may be of a variety of designs suitable for use in a continuous flow-through operation. To avoid sample contamination and other chemical compatibility problems, flow tubes of inert construction manufactured without chemical adhesive are preferred. A preferred design and construction without using chemical adhesives is disclosed in U.S. Pat. No. 5,867,026, entitled "Flow Tube for NMR Probe" although those of skill in the art will recognize that many other suitable NMR flow tubes may be used. Suitable flow tubes are typically 15 cm in length and 3 mm to 5 mm in outer diameter. The flow tubes comprise an inlet end leading to an analysis tube leading to an outlet end. As disclosed in U.S. Pat. No. 5,867,026, the inlet end and outlet end of the flow tube are thick-walled capillary tubing. The thick walls are mechanically strong and can be made to have low dead-volume (e.g. 0.010" i.d.). The thick-walled capillary tubing is preferable for connecting the inlet end of the flow tube to an inflow tube for supplying an eluent to the flow tube, and the outlet end to an outflow tube. The thick-walled capillary tubing provides added strength to the flow tube for attaching the inflow and outflow tubing.

If desired, the inlet and outlet ends of the NMR flow tube can be elongated sufficiently to extend beyond the ends of the probe housing for connecting to inflow and outflow tubing external to the probe. Using such an elongated flow tube eliminates the insertion of any connector to inflow or outflow tubing within the probe housing. This has the dual benefit of keeping the connectors away from the mechanically and electrically sensitive portions of the probe and allowing a smaller outer diameter guide tube to be used when internal probe space is very limited.

The inner diameter of the inlet end and outlet end of the flow tube can be selected to correspond to the respective capillary diameter of the eluent inflow tube and outflow tube. Preferably, the inner diameter of the inlet end and outlet end is from 0.01 inches to 0.04 inches, and more preferably from 0.02 inches to 0.03 inches. As further described in U.S. Pat. No. 5,867,026, the NMR flow tube preferably has an inner diameter of small-to-large-to-small geometry from the inlet end to the analysis tube to the outlet end. This small-to-large-to-small geometry reduces the amount of sample (analyte plus solvent) needed to fill the analysis tube and places an increased proportion of the total sample volume into the analysis tube. This feature is useful for samples available in limited quantities, of which liquid chromatography fractions are one example. It also helps maintain chromatographic separation when the flow tube is used for chromatographic analysis.

The inner diameter and length of the analysis tube can be selected and optimized for specific applications. For instance, the inner diameter can be chosen so that the total analysis volume and optimal field length for the NMR magnet being used are compatible with various HPLC applications. It is often preferable to choose the analysis tube length based on the length of the field center or sensitive volume of the NMR magnet bore. Then the inner diameter can be adjusted to a compromise point where LC integrity (which can be the primary consideration for small volume samples) is balanced by NMR sensitivity (which can be the primary consideration for large volume samples). Preferably, the inner diameter of the analysis tube is from 1 mm to 5 mm, and more preferably from 2 mm to 4 mm.

The inlet and outlet ends of the NMR flow tube may be attached with a variety of connectors to the inflow tubing for delivering an eluent to the flow tube and the outflow tubing removing an eluent. Suitable inflow and outflow tubing are of the type generally used in HPLC applications and well know to those of ordinary skill. Preferably, the tubing is PEEK or PTFE, or other materials familiar to those in the field of LC.

As shown in FIG. 1, the NMR flow tube 25 is preferably attached at both the inlet end 26 and the outlet end 27 to inflow and outflow tubing by means of connectors 28. Suitable connectors 28 are preferably the compression-style fittings commonly used in LC applications. Such connectors use ferrules and fittings which are positioned on the outside surface ends of the NMR flow tube. This results in a flow tube assembly having regions of larger outer diameter than the outside diameter of the NMR flow tube itself. Suitable connectors 28 are further illustrated in FIG. 6 as comprising a large hex nut 130, a short ferrule 132, a union 133, a long ferrule 135 and a small hex nut 137. The hex nuts, ferrules and union are preferably made of PEEK, PTFE, Kel-F, Tefzel or other materials known to those in the field of HPLC.

Figure 6:
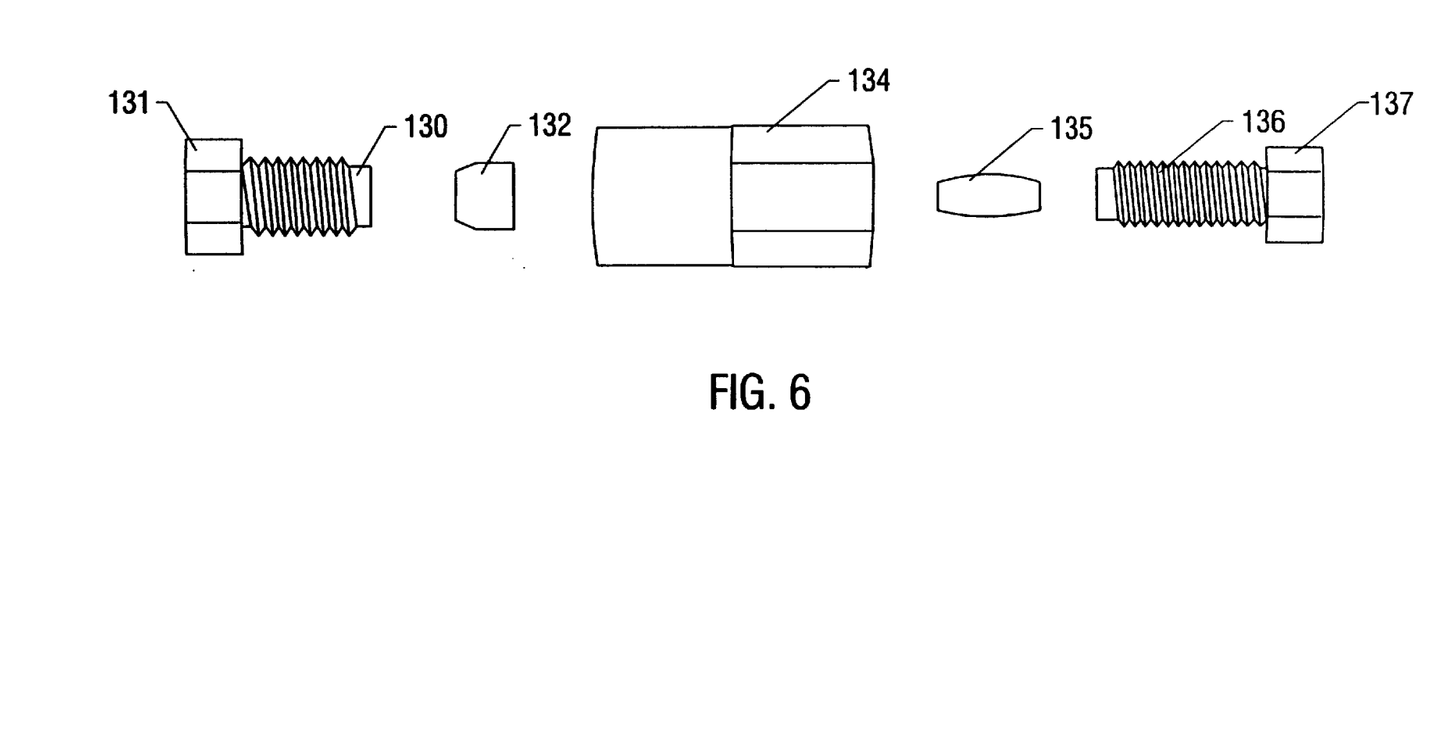
FIG. 6 is a side view of a compression fitting for connecting an NMR flow tube to an inflow or outflow tubing.

To attach the connector 28 to a flexible inflow tubing, an inflow tube of suitable diameter is passed through the small hex nut 137 and the long ferrule 135. The small hex nut is threaded into the union 134 and the assembly is tightened using appropriate mechanical aids (torque wrenches, fixtures, etc.) to create a compression seal with the tubing. The inlet end of an NMR flow tube is then inserted into the large hex nut 130 and small ferrule 132. The large hex nut is threaded into the opposite end of the union 134 as the inflow tubing and the connection is carefully tightened to produce a compression seal on the NMR flow tube. A similar procedure, in opposite order is used to attached the connector 28 to the outlet end of the flow tube and then to the outflow tubing. The connectors are easily removed by reversing the entire procedure.

The size of the compression-style fittings places some mechanical limitations on the probe and the method of inserting or removing the flow tube. Because of the large outer diameter of the compression style fittings, it is preferable to attach the inflow tubing to the inlet end of the NMR flow tube and then position the flow tube in the probe before attaching the outflow tubing to the outlet end of the flow tube. Although the guide tube must have a sufficient inner diameter to accommodate the connector attached to the inlet end of the flow tube, the inner diameter of the RF coil and other nested subassemblies in the probe can be kept small since only the NMR flow tube passes through that region of the probe. This promotes a better NMR filling factor since the diameter of the RF coil need not be significantly larger than the outer diameter of the NMR flow tube. Also, less modification of the probe is required since further change in the probe subassemblies is required.

Suitable compression fittings as shown in FIG. 6 are available commercially from Alltech and Upchurch. The union 134 and hex nuts 130 and 136 may be machined to reduce their outer diameter and more readily permit passage through the guide tube. The outer diameter of the connectors is preferably between 0.25 inches and 0.5 inches. Those of skill in the art will recognize that other modifications in the type and size of the ferrules, as well as the size and slope of the connector nuts and union, can be made to accommodate various design modifications. In a separate embodiment, the inlet and outlet ends of the NMR flow tube may be alternatively elongated to extend beyond the probe housing 33 and obviate the need to pass the connector 28 through the guide tube at all.

As shown in FIG. 4A, the upper insulator ring may preferably be notched or keyed 112 on top to accommodate the hexagonal head 131 of the hex nut 130 to allow the connector to seat in the upper insulator ring and position the flow tube for spectral measurements. The notch or key 112 can also be used to aid in tightening or loosening the compression-style fitting on the outlet end of the NMR flow tube. The upper insulator ring is preferably machined for two parallel outer surfaces 111, as shown in FIGS. 4A and 4C to allow the upper insulator ring to seat in the upper insulator without rotating and make it simpler to secure the upper insulator ring in position.

Those of skill in the art will understand that different connectors may be used in place of the compression-style fittings of FIG. 6 without deviating from the spirit of the invention. For example, other connectors with a suitably small outside diameter may be used in the invention, which would permit connection of flexible tubing to the inlet and outlet ends of the NMR flow tube before it is inserted into the probe. Moreover, it would also be possible for use in the invention to permanently seal or attach the inlet end 26 of the NMR flow tube to the inflow tubing 29 before positioning the flow tube in the probe and then use a detachable connector 28 only at the outlet end of the flow tube. To the extent such a permanent seal employed a chemical bonding or adhesive, however, it could give rise to chemical compatibility problems and sample contamination. Thus, it is preferred to use a detachable connector at both the inlet and outlet ends of the flow tube.

A second embodiment of the invention is shown in FIGS. 2 and 2A. This embodiment differs from FIGS. 1 and 1A in the design of the guide tube used in the flow-through probe. Referring to FIGS. 2 and 2A, there is a lower insulator 60 supported inside a substantially cylindrical probe housing 81. The probe housing has a central axis running substantially vertically from the top to the probe base 83. The lower insulator is preferably circular to fit within the probe housing 81 and has a top surface 61 and a lower aperture 62 which is sufficiently large to easily traverse an NMR flow tube 77. The lower aperture 62 is preferably a circular hole and is aligned on the central axis of the probe. The lower insulator 60 may also comprise apertures, channels, supports and connections for the probe subassemblies. The lower aperture 62 may further comprise steps or notches as shown in FIG. 2A to accommodate the shape and constraints of a lower insulator ring 69.

The probe of FIG. 2 further comprises an upper insulator 63 supported at a distance above lower insulator 60 and having an upper surface 64. The upper insulator 63 is also preferably circular to fit within the probe housing 81 and has an upper aperture 65 aligned with the lower aperture 62 along the central axis. The upper aperture 65 is preferably a circular hole of sufficient diameter to easily traverse an NMR flow tube 77. The upper insulator 63 may comprise additional apertures, channels, supports and connections for the probe subassemblies. Similar to FIG. 1A, an RF coil insert 90 or a free standing RF coil (not shown) may be positioned between the upper and lower insulators as illustrated in FIG. 2A. Commonly and preferably, the upper insulator 63 and the lower insulator 60 comprise the top and bottom ends of a housing for a pulsed field gradient.

An upper insulator ring 66 acts as a spacer ring in the upper aperture 65 to align the NMR flow tube 77 along the central axis of the probe. The inner diameter 68 of the upper insulator ring 66 is sufficient to slidably traverse the NMR flow tube 77. The ring 66 is disposed inside the upper aperture 65. The upper constraint 67 may bear against the upper surface 64 to position the ring 66 in place and maintain the position of the NMR flow tube 77 in the probe or the ring 66 may be otherwise secured. A suitable design for the upper and lower insulator rings, 66 and 69, is shown in FIGS. 4 and 5, respectively, as previously described for the embodiment of FIG. 1. Also, as shown in FIG. 2A, and previously described for embodiment of FIG. 1A, the upper and lower insulator rings 66 and 69 may be notched or keyed to accommodate the RF coil insert 90.

The embodiment of FIGS. 2 and 2A further comprises a guide tube 72 for communicating along the central axis of the probe through the lower insulator ring 69 and toward the upper insulator 63. The guide tube 72 has a first end with an inner diameter 73 which is substantially the same size as the inner diameter of the lower insulator ring 69. The guide tube 72 has an inner diameter at its second end 74 which is larger than the inner diameter of the first end and the inner surface of the guide tube is smoothly tapered 75 between the inner diameter of the first end 73 and the inner diameter of the second end 74. Preferably, the inner surface of the guide tube 72 is conically shaped from the smaller inner diameter at the first end 73 to the larger inner diameter 74.

The guide tube 72 is preferably cylindrical on the outside and may be constructed of one integral piece. For ease of construction, however, it may be constructed in two or more parts. The first part may be a straight tube having a large inner diameter as shown at 74 in FIG. 2. The second part may be a relatively shorter piece of tubing which has a tapered inner surface equivalent to 75, preferably conical, from a larger diameter of 74 to the smaller diameter of 73. The two parts are joined to form one integral guide tube 72 as shown in FIG. 2. The guide tube 72 is attached at the first end 76 to the bottom of the lower insulator 60 or to the lower insulator ring 69 as shown in FIG. 2A. The guide tube 72 may be attached to either the lower insulator 60 or the lower insulator ring 69 by a tight friction fit, permanent bond or preferably by threaded connection. The lower insulator 60 and lower insulator ring 69 may be substantially integral.

As shown in FIG. 2, an NMR flow tube 77 is extended through the guide tube 77 and the upper and lower insulators 63 and 60, and positioned along the central axis of the probe using the upper and lower insulator rings 66 and 69. The previous description of NMR flow tube 25 in FIG. 1 applies equally to flow tube 77 in FIGS. 2 and 2A just as the previous discussion of connectors applies to connectors 79 in FIG. 2. The inlet end of NMR flow tube 77 may alternatively be permanently sealed to flexible inflow tubing 78 as previously described for the embodiment of FIG. 1. Alternatively, as previously described, the NMR flow tube may be sufficiently elongated to eliminate the insertion of any connectors within the probe.

To position the NMR flow tube 77 in the probe of FIG. 2, the flow tube 77 with the attached flexible inflow tubing 78 is inserted up through the guide tube 72 from the base of the probe 83. The smoothly tapered inner surface of the guide tube 72 guides the flow tube 77 through the lower insulator ring 69 which acts as a spacer to align the flow tube along the central axis of the probe and guide it through the probe subassemblies. Once the flow tube is extended through the lower insulator ring 69, the lower insulator 60 and upper insulator 63, the upper insulator ring 66 is placed over the flow tube and slid into place in the upper aperture 65 to properly align the flow tube and, if necessary, securely position the RF coil insert 90. The outlet end of flow tube 77 is then connected to outflow tube 80 using the connector 79. An added advantage of this embodiment is that it eliminates the lower spacer ring of the first embodiment show in FIG. 1.

Another aspect of the invention is the method shown in FIG. 7 As illustrated in FIG. 7, a probe comprises a preferably cylindrical housing 200 with a central axis running substantially vertically through the housing. An upper insulator 202 is supported in the housing having an upper surface 203 and an upper aperture 204 aligned along the axis. An upper insulator ring 208 acts as a spacer to align the NMR flow tube 213 along the probe axis in the upper aperture 204 and is notched or keyed to accommodate the lower end of connector 214 and maintain the position of NMR flow tube 213 in the probe.

A lower insulator 205 is supported along the axis of the probe at a distance from the upper insulator 202. The lower insulator 205 has a lower aperture 206 aligned with the upper aperture 204 along the central axis. The inner diameter of the lower aperture is sufficient to slidably traverse an NMR flow tube 213. The upper insulator 202 and the lower insulator 205 preferably comprise the upper and lower ends of a pulsed field gradient coil 207.

In the method of the invention, a guide tube 210 is attached at a first end 209 to the bottom of the lower insulator 205 for communicating through the lower aperture 206 toward the upper aperture 204 along the central axis. The guide tube has an inner diameter at a second end 212 that is larger than the inner diameter of the first end and an inner surface that is substantially smoothly tapered 211, preferably conically from the inner diameter of the first end to the inner diameter of the second end.

Further in the method of the invention, the NMR flow tube 213 is connected to an inflow tube 215 by a connector 214. The NMR flow tube 213 is then slid up the guide tube from the second end 212 to slidably dispose or position the flow tube in the first end of the guide tube, through the lower aperture 206 and the upper aperture 204 with the outlet end of the flow tube 213 extending beyond the upper surface 203 of the upper insulator 202. The upper insulator ring 208 is then slid over the outlet end of the flow tube 213 and disposed inside the upper aperture 204. The outlet end of the flow tube 213 is attached to an outflow tube 216 with a connector 214 and the lower end of the connector 214 is positioned in the key or notch on the top of the upper insulator ring 200.

The connectors 214 are preferably the compression style fittings as described and illustrated in FIG. 6. The upper insulator ring 208 may be keyed or notched and the outside periphery machined as shown in FIGS. 4A and 4B to aid in attaching the connector 214 to the outlet end of the flow tube. Various tools (torque wrenches, etc.) may also be useful in attaching the connector. Additional tools and aids may be used to insert the flow tube 213 into the probe as shown in FIG. 7. For example, fitting housing 217 can be placed over the connector 214 and then attached to a push rod 218 to transfer the flow tube 213 through the guide tube 210. The fitting housing 217 and push rod 218 are removed once the NMR flow tube 213 is in place in the probe.

An NMR flow tube inserted in a flow-through probe according to the invention can easily be removed for exchange or modification by reversing the steps for insertion. Referring again to FIG. 7, to remove the flow tube 213 once it has been inserted in the probe and connected to an outflow tube 216 is first disconnected from the outlet end of the NMR flow tube 213, also removing the connector 214 from the outlet end of the flow tube. The upper insulator ring 208 is then removed by sliding it up and off of the flow tube 213. Flow tube 213 is then extracted from the probe by sliding the flow tube and attached inflow tubing 213 down the guide tube 210 and out the second end 212.

The present invention has been described in considerable detail with regard to the preferred embodiments thereof It will be understood, however, that the above-described arrangements of apparatus and the methods therefrom are merely illustrative of applications of the principles of this invention and many other embodiments and modifications may be made without departing from the spirit and scope of the invention as defined in the claims. Therefore, the appended claims should not be limited to the descriptions of the preferred embodiments, materials, or methods described herein to illustrate the invention.

What is claimed is:

1. A flow-through NMR probe comprising:
   a lower insulator having a lower aperture;
   an upper insulator, supported at a distance above the lower insulator and having an upper aperture, the upper aperture aligned on a substantially vertical axis with the lower aperture;
   an upper insulator ring positioned in the upper aperture, having an inner diameter sufficient to slidably traverse an NMR flow tube and being keyed on top to fit a lower end of a removable connector;
   a lower insulator ring positioned in the lower aperture and having an inner diameter sufficient to slidably traverse an NMR flow;
   a guide tube having a first end and a second end, and an inner diameter sufficient to slidably traverse a spacer ring, the guide tube attached at the first end to the lower insulator for communicating through the lower aperture toward the upper aperture substantially along the vertical axis;
   a spacer ring slidably disposed in the guide tube below the lower insulator, the spacer ring having an inner diameter sufficient to tightly fit around an NMR flow tube;
   an NMR flow tube having an inlet end and an outlet end, the flow tube slidably disposed through the spacer ring, the first end of the guide tube, the lower aperture, the lower insulator ring, the upper aperture and the upper insulator ring, and substantially aligned along the vertical axis, the inlet end of the flow tube connected to an inflow tube; and
   a removable connector connecting the outlet end to an outflow tube, the lower end of the removable connector seated in the key in the top of the upper insulator ring.

2. The flow-through NMR probe of claim 1 further comprising a removable connector connecting the inlet end of the NMR flow tube to the inflow tube.

3. The flow-through NMR probe of claim 2 wherein the removable connectors are compression-style fittings.

4. The flow-through NMR probe of claim 3 wherein the lower insulator ring, the upper insulator ring and the spacer ring further comprise channels through each ring to direct air flow past the NMR flow tube.

5. The flow-through NMR probe of claim 3 wherein the lower insulator ring is an integral part of the lower insulator.

6. The flow-through NMR probe of claim 5 wherein the upper insulator and lower insulator further comprise a housing for a pulsed field gradient coil.

7. The flow-through NMR probe of claim 3 wherein the inlet end of the NMR flow tube is elongated to extend beyond the second end of the guide tube.

8. The flow-through NMR probe of claim 3 wherein the guide tube is attached at the first end to the lower insulator ring instead of the lower insulator.

9. A flow-through NMR probe comprising:
   a lower insulator having a lower aperture;
   an upper insulator supported at a distance above the lower insulator, and having an upper surface and an upper aperture, the upper aperture aligned on a substantially vertical axis with the lower aperture;
   an upper insulator ring disposed in the upper aperture, having an inner diameter sufficient to slidably traverse an NMR flow tube and being keyed on top to accommodate a lower end of a removable connector;
   a lower insulator ring disposed in the lower aperture and having an inner diameter sufficient to slidably traverse an NMR flow tube;
   a guide tube having a first end with an inner diameter substantially equal to the inner diameter of the lower insulator ring, a second end with an inner diameter larger than the inner diameter of the first end, and an inner surface substantially smoothly tapered from the inner diameter of the first end to the inner diameter of the second end, the guide tube being attached at the first end to the lower insulator ring for communicating through the lower insulator ring toward the upper aperture along the vertical axis;
   an NMR flow tube having an inlet end connected to an inflow tube and having an outlet end, the flow tube being slidably disposed through the first end of the guide tube, the lower insulator ring, the lower aperture, the upper aperture and the upper insulator ring; and
   a removable connector connecting the outlet end to an outflow tube, the lower end of the connector seated in the key in the top of the upper insulator ring.

10. The flow-through NMR probe of claim 9 further comprising a removable connector connecting the inlet end of the NMR flow tube to the inflow tube.

11. The flow-through NMR probe of claim 10 wherein the removable connectors are compression-style fitting.

12. The flow-through NMR probe of claim 11 wherein the upper insulator ring and lower insulator ring further comprise channels through the rings to direct air flow past the NMR flow tube.

13. The flow-through NMR probe of claim 10 wherein the lower insulator and the lower insulator ring are substantially integral.

14. The flow-through NMR probe of claim 10 wherein the upper and lower insulator further comprise a housing for a pulsed field gradient coil.

15. The flow-through NMR probe of claim 10 wherein the inlet end of the NMR flow tube is elongated beyond the second end of the guide tube.

16. A replaceable NMR flow tube assembly for use in a flow-through NMR probe wherein the probe comprises a lower insulator having a lower aperture, and upper insulator supported at a distance above the lower insulator and having an upper aperture, the upper aperture aligned on a substantially vertical axis with the lower aperture, the NMR flow tube assembly comprising:

an upper insulator ring positioned in the upper aperture, having an inner diameter sufficient to slidably traverse an NMR flow tube and being keyed on top to accommodate a lower end of a removable connector;

a lower insulator ring positioned in the lower aperture and having an inner diameter sufficient to slidably traverse an NMR flow tube;

a guide tube having a first end with an inner diameter substantially equal to the inner diameter of the lower insulator ring, a second end with an inner diameter larger than the inner diameter of the first end, and an inner surface substantially smoothly tapered from the inner diameter of the first end to the inner diameter of the second end, the guide tube being attached to the lower insulator ring for communicating through the lower aperture toward the upper aperture substantially along the axis;

an NMR flow tube having an inlet end and an outlet end and being slidably disposed through the first end of the guide tube, the lower insulator ring, the lower aperture, the upper aperture, and the upper insulator ring, the inlet end of the flow tube being connected to an inflow tube; and a removable key in the connector connecting the outlet end to an outflow tube, the lower end of the connector seated in the top of the upper insulator ring.

17. The flow-through NMR probe of claim 16 further comprising a removable connector connecting the inlet end of the NMR flow tube to the inflow tube.

18. The flow-through NMR probe of claim 17 wherein the removable connectors are compression style fittings.

19. The flow-through NMR probe of claim 18 wherein the lower insulator ring and upper insulator ring further comprise channels through the ring to direct air flow past NMR flow tube.

20. A method for inserting an NMR flow tube into a flow-through NMR probe, wherein the probe comprises a lower insulator having a lower aperture, and an upper insulator supported at a distance above the lower insulator and having an upper aperture, the upper aperture aligned on a substantially vertical axis with the lower aperture, the method comprising:

attaching a guide tube at a first end to the lower insulator for communicating through the lower aperture toward the upper aperture along the axis, the guide tube having an inner diameter at the first end sufficient to slidably traverse an NMR flow tube and align the tube along the axis, a second end having an inner diameter larger than the inner diameter of the first end, and an inner surface substantially smoothly tapered from the inner diameter of the first end to be inner diameter of the second end;

slidably disposing an NMR flow tube, having an inlet end and an outlet end, through the guide tube, the lower aperture, the upper aperture and an upper insulator ring, the inlet end being connected to an inflow tube and the upper insulator being keyed to accommodate a lower end of a connector;

slidably extending the upper insulator ring into the upper aperture to align the outlet end of the flow tube along the axis; and connecting the outlet end to an outflow tube with a connector having a lower end and seating the lower end in the key in the top of the upper insulator ring.

21. The method of claim 20 wherein the outlet end of the NMR flow tube is connected to the outflow tube using a compression-style fitting.

22. The method of claim 21 wherein the inlet end of the NMR flow tube is detachably connected to the inflow tube using a compression-style fitting.

23. A method for removing an NMR flow tube from a flow-through NMR probe, wherein the probe comprises a lower insulator having a lower aperture, and an upper insulator supported at a distance above the lower insulator and having an upper aperture, the upper aperture aligned with the lower aperture along the central axis, a guide tube attached at a first end to the lower insulator for communicating through the lower aperture toward the upper aperture along the axis, the guide tube having an inner diameter at the first end sufficient to slidably traverse an NMR flow tube and align the tube along the axis, a second end having an inner diameter larger than the inner diameter of the first end, and an inner surface substantially smoothly tapered from the inner diameter of the first end to the inner diameter of the second end, the NMR flow tube slidably disposed inside the first end of the guide tube, the lower aperture, the upper aperture and an upper insulator ring, the ring disposed in the upper aperture and being keyed on top to accommodate a removable connector, the flow tube having an inlet end connected to an inflow tube and an outlet end connected by a removable connector to an outflow tube, the removable connector seated in the key in the top of the upper insulator ring, the method comprising:

removing the connector from the outlet end of the flow tube;

slidably extracting the upper insulator ring from the upper aperture and the flow tube;

slidably extracting the flow tube from the upper aperture, the lower aperture through the guide tube.

* * * * *